United States Patent
Bhalla et al.

(10) Patent No.: US 8,896,131 B2
(45) Date of Patent: Nov. 25, 2014

(54) CASCODE SCHEME FOR IMPROVED DEVICE SWITCHING BEHAVIOR

(75) Inventors: Anup Bhalla, Santa Clara, CA (US); Sik Lui, Sunnyvale, CA (US); Jun Hu, San Bruno, CA (US); Fei Wang, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 55 days.

(21) Appl. No.: 13/020,758

(22) Filed: Feb. 3, 2011

(65) Prior Publication Data

US 2012/0199875 A1    Aug. 9, 2012

(51) Int. Cl.
| | | |
|---|---|---|
| H01L 23/528 | (2006.01) |
| H03K 17/10 | (2006.01) |
| H03K 17/04 | (2006.01) |
| H01L 27/085 | (2006.01) |
| H01L 27/06 | (2006.01) |
| H03K 17/567 | (2006.01) |
| H03K 17/687 | (2006.01) |

(52) U.S. Cl.
CPC .......... *H03K 17/6871* (2013.01); *H03K 17/102* (2013.01); *H03K 17/0406* (2013.01); *H03K 2017/6875* (2013.01); *H01L 27/085* (2013.01); *H01L 27/0629* (2013.01); *H03K 17/567* (2013.01)
USPC ..................... 257/777; 257/692; 257/E23.031

(58) Field of Classification Search
CPC ....... H01L 23/48; H01L 23/52; H01L 23/538; H01L 24/01; H01L 24/80; H01L 24/0657
USPC .................. 257/777, 692, E23.031, E23.079, 257/E23.142, E23.141, E23.169
See application file for complete search history.

(56) References Cited

U.S. PATENT DOCUMENTS

| | | | |
|---|---|---|---|
| 3,982,264 A | * | 9/1976 | Ishitani .......................... 257/266 |
| 4,663,547 A | | 5/1987 | Baliga |
| 5,396,085 A | | 3/1995 | Baliga |
| 6,144,093 A | | 11/2000 | Davis et al. |
| 6,300,146 B1 | | 10/2001 | Thierry |
| 6,404,050 B2 | | 6/2002 | Davis et al. |
| 6,593,622 B2 | | 7/2003 | Kinzer et al. |
| 6,768,146 B2 | | 7/2004 | Yoshida |
| 6,900,537 B2 | | 5/2005 | Sridevan |

(Continued)

OTHER PUBLICATIONS

Green, Bruce, Kenneth Chu, Joseph Smart, Vinayak Tilak, Hyungak Kim, James Shealy, and Lester Eastman. "Cascode Connected AlGaN/GaN HEMTs on SiC Substrates." IEEE Microwave and Guided Wave Letters 10.8 (2000): 316-18.

(Continued)

Primary Examiner — Wael Fahmy
Assistant Examiner — Sarah Salerno
(74) Attorney, Agent, or Firm — Joshua D. Isenberg; JDI Patent

(57) ABSTRACT

A switching device includes a low voltage normally-off transistor and a control circuit built into a common die. The device includes source, gate and drain electrodes for the transistor and one or more auxiliary electrodes. The drain electrode is on one surface of a die on which the transistor is formed, while each of the remaining electrodes is located on an opposite surface. The one or more auxiliary electrodes provide electrical contact to the control circuit, which is electrically connected to one or more of the other electrodes.

23 Claims, 21 Drawing Sheets

(56) References Cited

U.S. PATENT DOCUMENTS

| | | | |
|---|---|---|---|
| 7,348,612 | B2 | 3/2008 | Sriram et al. |
| 7,443,014 | B2 | 10/2008 | Otremba |
| 7,501,670 | B2 | 3/2009 | Murphy |
| 7,547,964 | B2 | 6/2009 | Pavier et al. |
| 7,569,870 | B2 | 8/2009 | Yanagihara et al. |
| 7,719,055 | B1 | 5/2010 | Mcnutt et al. |
| 7,745,930 | B2 | 6/2010 | Connah et al. |
| 7,800,217 | B2 | 9/2010 | Otremba et al. |
| 7,808,102 | B2 | 10/2010 | Hebert et al. |
| 7,825,435 | B2 | 11/2010 | Machida et al. |
| 7,825,508 | B2 | 11/2010 | Hebert et al. |
| 7,868,431 | B2 | 1/2011 | Feng |
| 7,939,857 | B1 | 5/2011 | Wyatt |
| 2003/0098462 | A1 | 5/2003 | Yoshida |
| 2004/0012052 | A1 | 1/2004 | Kawamoto |
| 2006/0113593 | A1* | 6/2006 | Sankin et al. ............ 257/341 |
| 2008/0017907 | A1 | 1/2008 | Otremba |
| 2008/0304305 | A1* | 12/2008 | Chang et al. ............ 363/147 |
| 2009/0065861 | A1 | 3/2009 | Bhalla |
| 2009/0085656 | A1* | 4/2009 | Havanur ............ 327/581 |
| 2009/0167477 | A1 | 7/2009 | Feng |
| 2010/0019391 | A1* | 1/2010 | Strzalkowski ............ 257/777 |
| 2010/0200920 | A1 | 8/2010 | Su et al. |
| 2011/0024917 | A1* | 2/2011 | Bhalla et al. ............ 257/777 |
| 2011/0049580 | A1 | 3/2011 | Lui |

OTHER PUBLICATIONS

AlGaN/GaN HEMT's an overview of device operation and applications, U.K. Mishra, P. Parikh and Y.F. Wu, Electrical and Computer Engineering Department, US Santa Barbara, (http:my.ece.ucsb.edu/mishra/classfiles/overview.pdf)n.d.

Gang, Shao, Liu Xinyu, He Zhijing, Liu Jian, and Wu Dexin. "Cascode Connected AlGaN/GaN Microwave HEMTs on Sapphire Substrates." Chinese Journal of Semiconductors 25.12 (2004):1567-572.

Allen, S.T et al. "Invited—Progress in High Power SiC Microwave MESFETs." 1999 IEEE MTT-S Digest (1999): 321-24.

Binari, S.C., P.B Klein, and T.E. Kazior. "Trapping Effects in GaN and SiC Microwave FETs". Proceedings of the IEEE 90.6 (2002) :1048-058.

Zhang, A.P., et al. "Influence of 4H-SiC Semi-Insulating Substrate Purity on SiC Metal -Semiconductor Field Effect Transistor Performance." Journal of Electronic Materials 5th ser. 32 (2003): 437-43.

Ohno Yasuo, and Massaki Kuzuhara. "Application of GaN-Based Heterojunction FETs for Advanced Wireless Communication". IEEE Transactions on Electron Devices 48.3 (2001): 517-23.

I, Ahmad, et al, Evaluation of Different Die Attach Film and Epoxy Pastes for Stacked Die QFN Package, 9th Electronics Packaging Technology Conference p. 869-873 (2007).

Gallium Nitride (GaN) versus Silicon Carbide (SiC) in the High Frequency (RF) and Power Switching Applications, Microsemi PGD, pp. 1-8.

Chinese Office Action for CN Application No. 2012100246125, dated Dec. 23, 2013.

Taiwanese Office Action for TW Application No. 10221786760, dated Dec. 26, 2013.

\* cited by examiner

CASCODE SCHEME FOR IMPROVED DEVICE SWITCHING BEHAVIOR

FIELD OF INVENTION

Embodiments of the present invention are related to a cascoded field effect transistor scheme for improved device switching behavior.

BACKGROUND OF INVENTION

Many circuits involve the use of what is known as a Baliga-pair (i.e., cascode/composite device) to perform switching during operation. FIG. 1A is a schematic diagram illustrating one of these cascode devices. A cascode/composite device 101 comprises a low-voltage normally-off device 105 in series with a high-voltage normally-on device 103. Hereinafter, cascode device, composite device, and package will be used interchangeably to describe the above mentioned device. The low-voltage normally-off device 105 includes a gate 107, source 111, and drain 109. By way of example, and not by way of limitation, the low-voltage device may be a metal-oxide-semiconductor field effect transistor (MOSFET). The high-voltage normally-on device 103 also includes a gate 113, a source 117, and a drain 115. By way of example, and not by way of limitation, the high-voltage normally-on device may be a junction gate field-effect transistor (JFET) or a hetero structure field effect transistor (HFET). The gate 113 of the high-voltage normally-on device 103 is electrically connected to the source 111 of the low-voltage normally-off device 105, and the source 117 of the high-voltage normally-on device 103 is electrically connected to the drain 109 of the low-voltage normally-off device 105. For purposes of example, the following description will involve a MOSFET connected in series with a JFET.

The cascode device functions as a single switching device when implemented within a circuit scheme. When no gate bias is applied to the MOSFET 105, the device 101 cannot conduct current because voltage builds up across the low voltage MOSFET 105, reverse biasing the gate of the normally-on JFET 103. The application of positive voltage to the drain 117 of the JFET 103 appears directly on the drain of the low voltage FET, and this reverse biases its gate 113. Once the reverse bias is sufficient to pinch of the JFET 103, all the further applied voltage is supported by the high voltage JFET between its drain and source. When a positive voltage is applied to the MOSFET gate 107, with respect to the source 111, the MOSFET 105 turns on. This short circuits the gate 113 of the JFET to the source 117 of the JFET and allows current flow from the source 117 of the JFET to the drain 115 of the JFET, since the potential barrier has been removed.

Certain characteristics exhibited by the cascode/composite device are not ideal. It is within this context that embodiments of the present invention arise.

DESCRIPTION OF SPECIFIC EMBODIMENTS

Introduction

The prior art cascode device described above, namely a low voltage normally-off field effect transistor in series with a high voltage normally-on field effect transistor, exhibits certain non-optimal turn-on and turn-off characteristics. FIGS.

1C and 1D illustrate the turn-on behavior and turn-off behavior of one of these composite devices, respectively. The particular composite device in question includes a metal-oxide-semiconductor field effect transistor (MOSFET) (i.e., low-voltage normally-off device) in series with a junction gate field-effect transistor (JFET) (i.e., high voltage normally-on device).

Figure 1A:
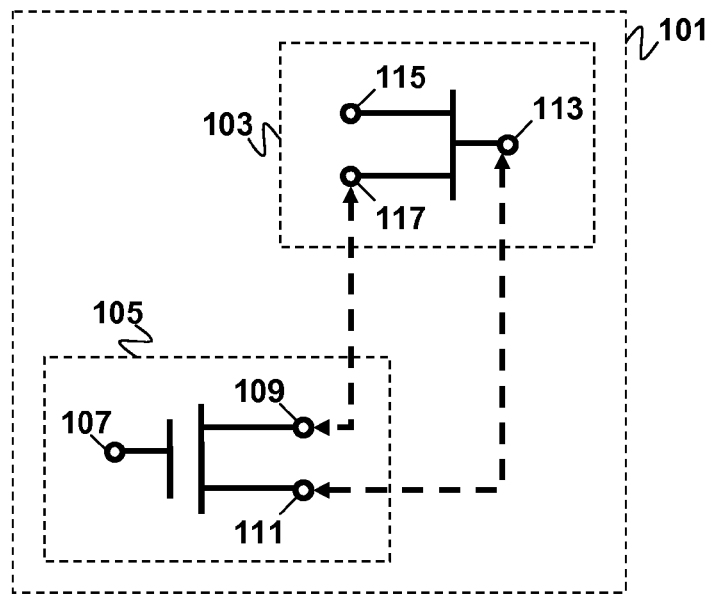
FIG. 1A is a schematic circuit diagram illustrating a prior art cascode device with a low-voltage normally-off device in series with a high-voltage normally-on device
Figure 1B:
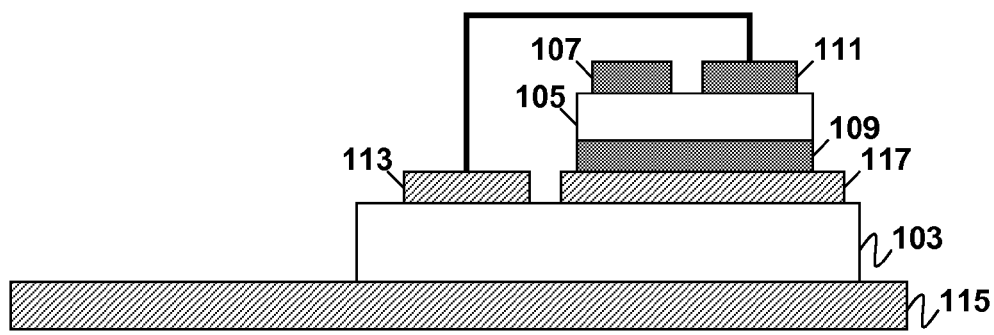
FIG. 1B is a cross-section of a prior art cascode device with a low-voltage normally-off device in series with a high-voltage normally-on device.
Figure 1C:
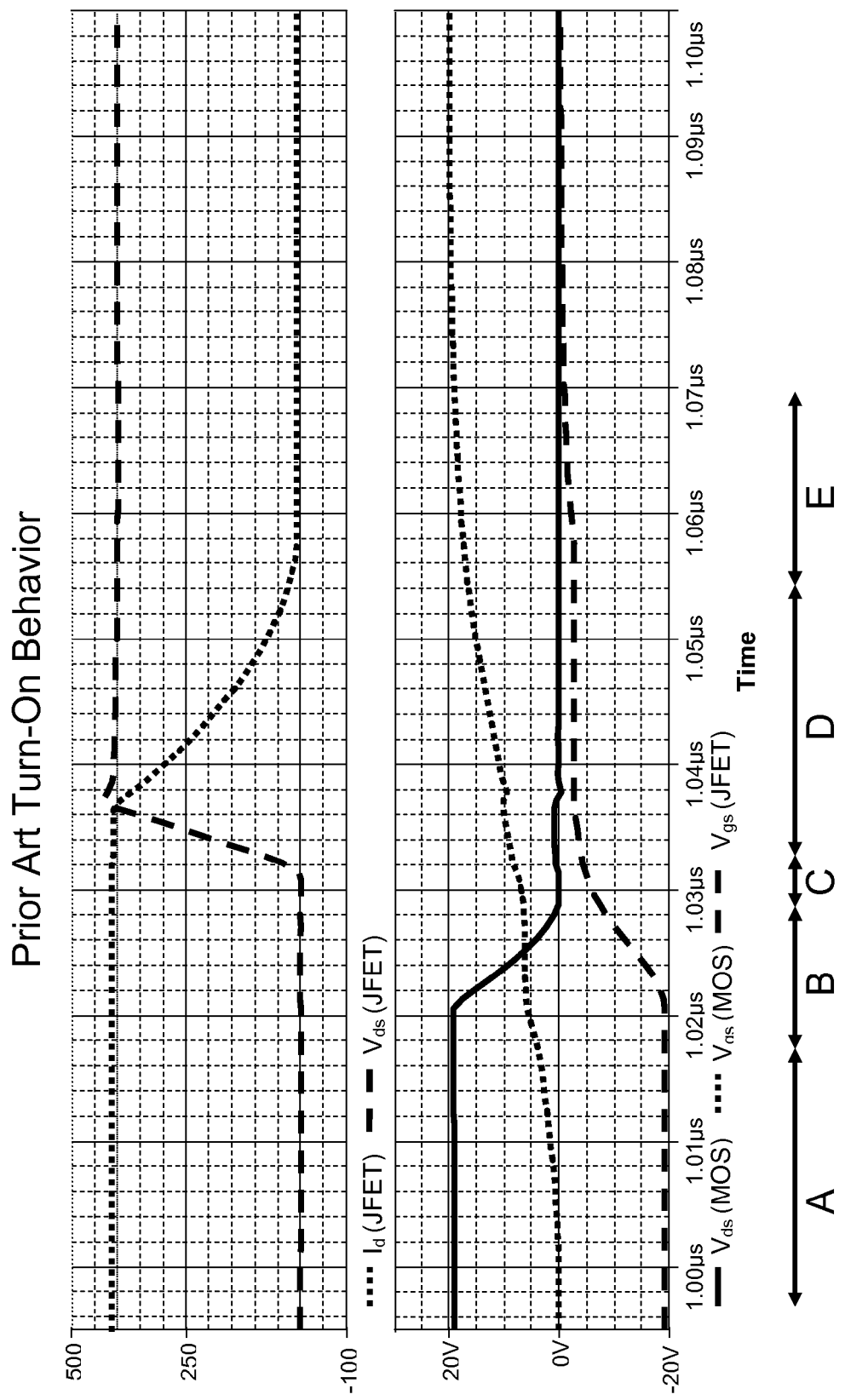
FIG. 1C are graphs illustrating the turn-on behavior of the prior art cascode device.

In FIG. 1C, the turn-on behavior of the semiconductor device package is illustrated. The dotted line in the upper graph illustrates the behavior of the JFET current ($I_d$(JFET)) and the dashed line in the upper graph illustrates the behavior of the JFET drain-source voltage ($V_{ds}$(JFET)) as functions of time. In the lower graph in FIG. 1C the dotted line illustrates the JFET gate-source voltage ($V_{gs}$(JFET)); the solid line illustrates the MOSFET drain-source voltage ($V_{ds}$(MOS)); and the dashed line illustrates the MOSFET gate-source voltage ($V_{gs}$(MOS)) as functions of time. The cascode device's operation during turn-on can be divided into 5 distinct time periods (i.e., A, B, C, D, and E) which describe different behavioral characteristics that occur during turn-on.

During time period A, the MOSFET gate voltage $V_{gs}$(MOS) charges to its threshold voltage ($V_{th}$). Because the MOSFET drain stays fixed during this period, the JFET gate-source voltage ($V_{gs}$(JFET)) remains reverse biased, e.g., at −20 V. During time period B, the MOSFET drain voltage $V_{ds}$(MOS) begins to fall, while the MOSFET gate voltage $V_{gs}$(MOS) remains at a plateau (i.e., at its plateau voltage value ($V_{GP}$)). As the MOSFET drain voltage $V_{ds}$(MOS) falls, so too does the JFET gate-source voltage $V_{gs}$(JFET), which decreases to its pinch-off voltage ($V_{pinch}$).

During time period C, the JFET gate-source voltage $V_{gs}$(JFET) decreases slowly as dictated by the $R_g*C_{gs}$ time constant of the JFET, wherein $R_g$ is the gate resistance and $C_{gs}$ is the gate-source capacitance. As the JFET current ramps up, the MOSFET gate voltage $V_{gs}$(MOS) increases slightly to allow for the increase in JFET current to be able to flow through the low voltage MOSFET as well. This period ends when the current reaches its final operating value $I_{OP}$. During time period D, the JFET gate-source voltage $V_{gs}$(JFET) remains at a negative bias that just barely allows current $I_{OP}$ to pass, effectively the Miller plateau of the JFET. This limits the voltage developed across the JFET internal gate resistance, which in turn limits the gate current available to discharge the JFET Miller capacitance. The drain-source voltage $V_{ds}$(JFET) across the JFET falls during this time period.

Finally, during time period E, the voltage transition is completed while the JFET gate-source voltage $V_{gs}$(JFET) discharges to near zero and the MOSFET gate voltage $V_{gs}$(MOS) finishes charging to the applied gate voltage. Thus, the prior art composite device exhibits an extremely slow-rate of turn-on especially if the JFET gate to drain capacitance and internal gate resistance is high, which is commonly the case with wide bandgap semiconductor JFETs, and this is quite undesirable in the context of power circuit switching. The slow turn-on rate of the cascode device can lead to high turn-on transition losses in a switching circuit, degrading efficiency.

Figure 1D:
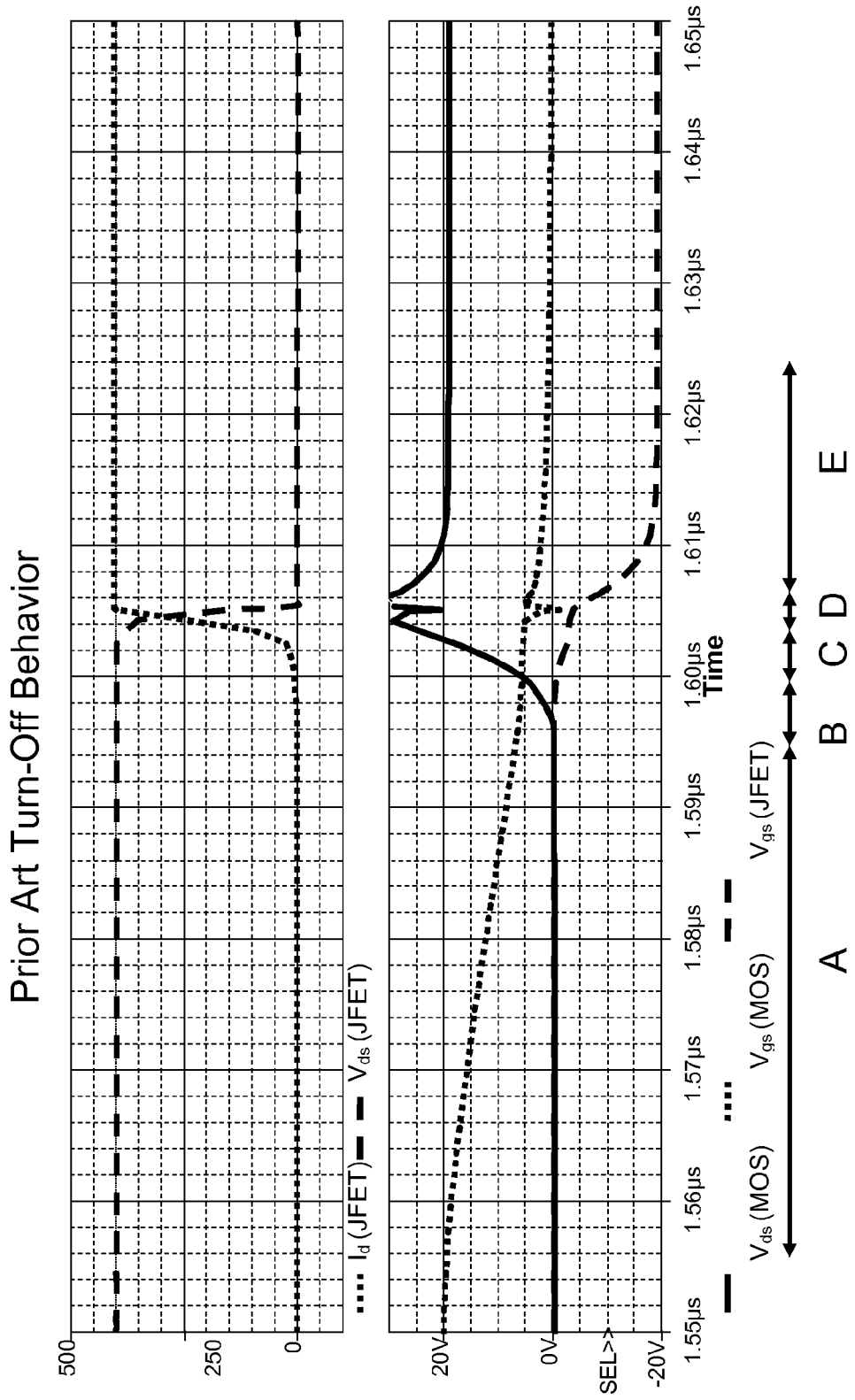
FIG. 1D are graphs illustrating the turn-off behavior of the prior art cascode device.

In contrast to the slow turn-on rate of this prior art composite device, the turn-off rate is extremely fast. FIG. 1D illustrates the turn-off behavior of the prior art composite cascode device. The upper graph in FIG. 1D illustrates the behavior of the JFET current $I_d$(JFET) as well as the behavior of the JFET drain-source voltage $V_{ds}$(JFET) as a function of time. The lower graph in FIG. 1D illustrates the JFET gate-source voltage $V_{gs}$(JFET), the MOSFET drain-source voltage $V_{ds}$(MOS), and the MOSFET gate-source voltage $V_{gs}$(MOS) as functions of time. The cascode device's operation during turn-off can be divided into five distinct time periods (i.e., A, B, C, D, and E) which describe different behavioral characteristics associated with turn-off.

During time period A, the MOSFET gate discharges to its plateau voltage $V_{GP}$, while the JFET voltages remain largely unchanged. During time period B, with the MOSFET gate remaining still at its plateau voltage, the MOSFET drain-source voltage starts to increase, stopping when the JFET gate-source voltage reaches a value that just barely sustains the current flow through the composite device. This is commonly referred to as the Miller plateau voltage of the JFET.

During time period C, with the JFET gate-source voltage at the value reached in time period B, the JFET miller capacitance is charged and the JFET drain-source voltage begins to ramp up. During this time, the MOSFET miller capacitance is also charged, and the MOSFET drain-source voltage increases. Thus, both the MOSFET drain/JFET source and the JFET gate voltage rise even though the JFET gate-source voltage remains constant. JFET gate current, which is the result of dividing the JFET gate voltage by the JFET internal resistance, can be quite large during this period. This in turn causes an extremely fast turn-off dV/dt.

During time period D, the JFET gate-source voltage is driven to pinch-off and the JFET current falls. The high value of JFET gate voltage allows a large gate current in the JFET, rapidly discharging the JFET gate-source capacitance, leading to the occurrence of a fast turn-off dI/dt. This potentially leads to parasitic oscillations in real circuits. Thus, the cascoded device exhibits an extremely fast rate of turn-off, which is quite undesirable in the context of power circuit switching. The rapid turn-off rate of the prior art composite device can be attributed to the larger voltage appearing at the JFET gate during turn-off, which drives a much higher current to the internal gate resistance allowing the JFET to switch extremely fast, leading to oscillations, electromagnetic interference (EMI) problems and circuit failures.

It is important to note that the issues of slow turn-on and fast turn-off are associated with all cascode devices that involve a low-voltage normally-off device in series with a high-voltage normally-on device, and are not limited to MOSFET/JFET configurations. However, for purposes of example and not of limitation, the present description focuses on the MOSFET/JFET configuration when discussing potential methods for resolving behavioral issues associated with composite devices. This of particular interest with wide bandgap high voltage devices that have higher gate-drain capacitance ($C_{gd}$) and high internal gate resistance.

Figure 2A:
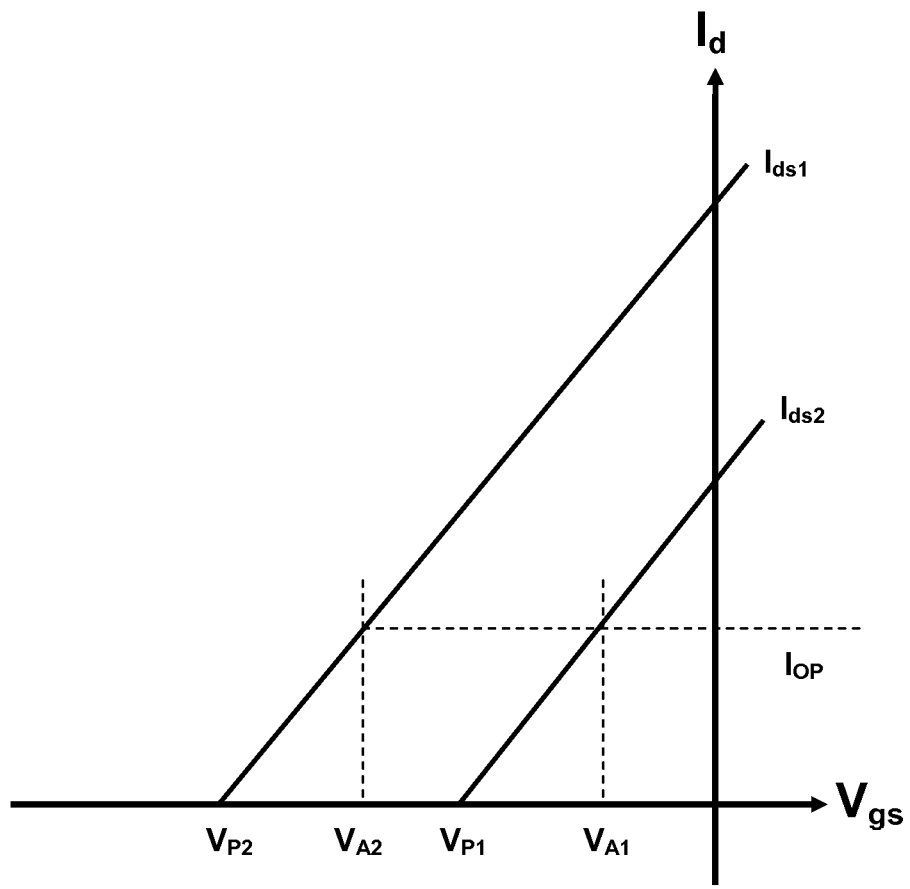
FIG. 2A is a graph illustrating transconductance curves for normally-on devices, each normally-on device having a different pinch-off voltage.

One way to resolve the issue of slow turn-on involves increasing the pinch-off voltage (i.e., more negative turn-off voltage) of the high-voltage normally-on field effect transistor (e.g. JFET). FIG. 2A is a graph illustrating transconductance curves for two variants of a normally-on JFET device, each JFET device having a different pinch-off voltage. These transconductance curves illustrate JFET device current ($I_D$) as a function of JFET gate-source voltage ($V_{GS}$) for each device with a different pinch-off voltage. If the operating current of the device is $I_{OP}$, then the on-state voltage drop across the gate-source of the JFET will be $V_{A1}$ and $V_{A2}$ respectively for devices with different pinch-off/threshold voltages (i.e., $V_{P1}$ and $V_{P2}$). Since the maximum JFET gate current is $V_{A1}/(R_{g(JFET)})$ or $V_{A2}/(R_{g(JFET)})$ for the respective devices with the same miller capacitance, the device with the more negative pinch-off will turn on faster. Here $R_{g(JFET)}$ is the JFET internal gate resistance.

Figure 2B:
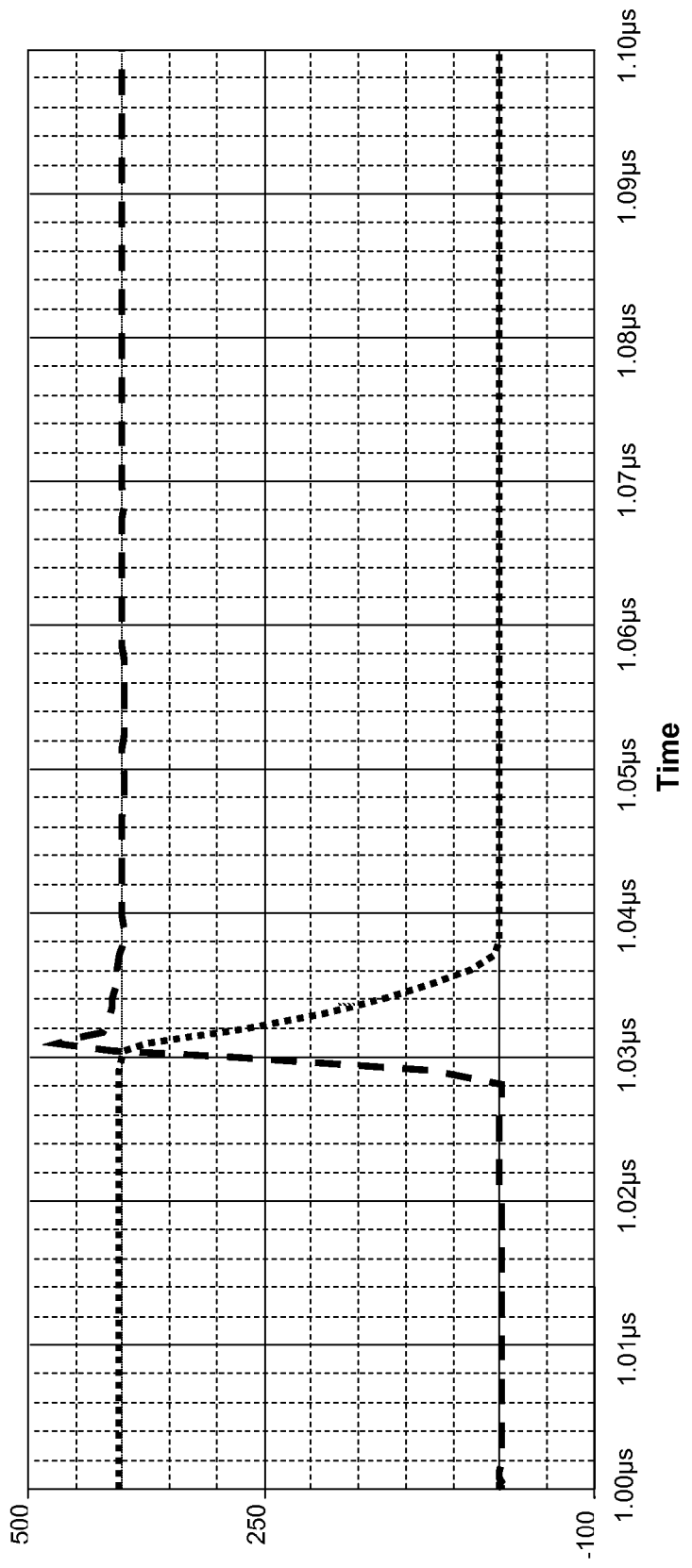
FIG. 2B is a graph illustrating the turn-on behavior of a cascode device with increased pinch-off voltage according to an embodiment of the present invention.
Figure 2C:
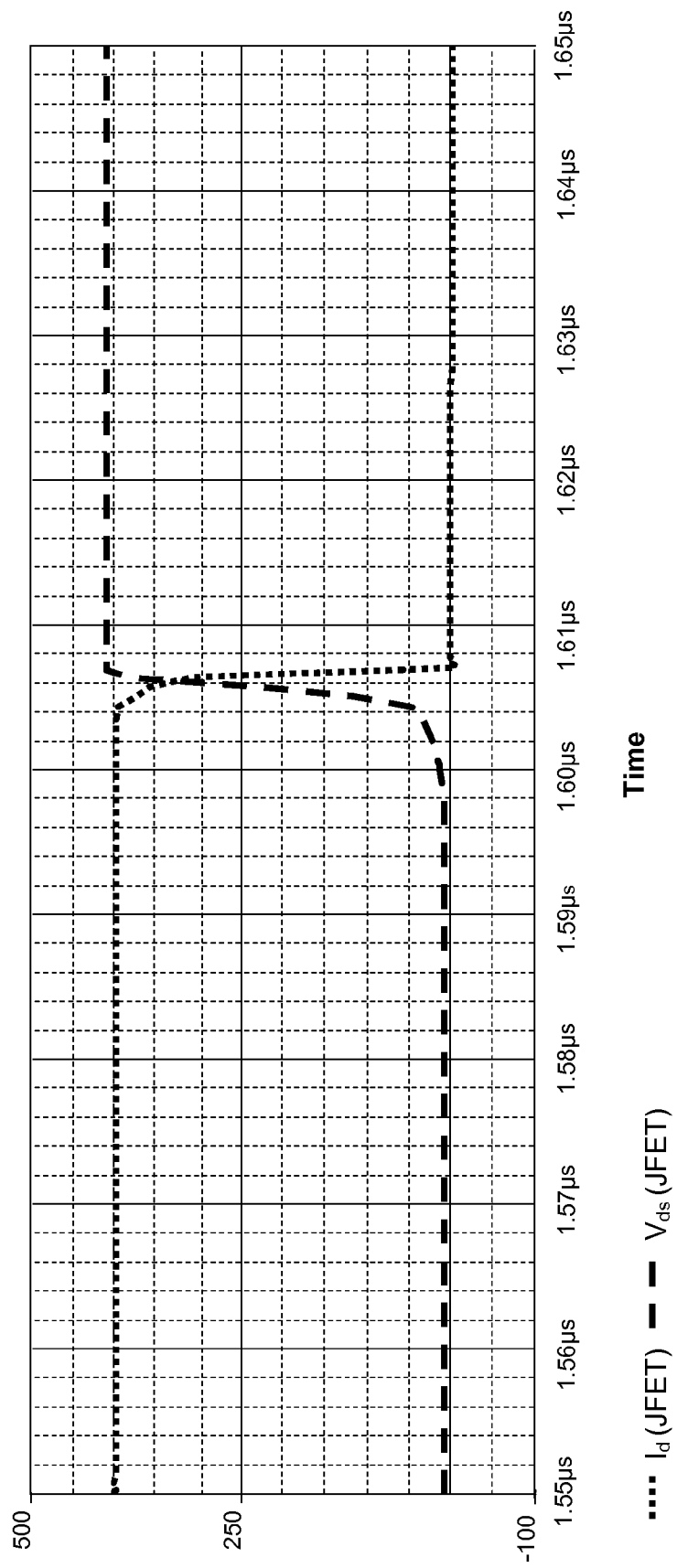
FIG. 2C is a graph illustrating the turn-off behavior of a cascode device with increased pinch-off voltage according to an embodiment of the present invention.

By increasing the pinch-off voltage, the cascode composite device will have more negative voltage available to drive current to the JFET's internal gate resistance. The larger voltage drop across the JFET internal gate resistance will ultimately lead to a faster turn-on rate. FIGS. 2B and 2C illustrate the turn-on behavior and turn-off behavior of a device package configured to have a JFET pinch-off voltage of −10V. As compared to the turn-on behavior of the prior art cascode device with, say a −5V pinch-off, the turn-on speed for the composite device in FIG. 2B is much improved for a device with the same JFET internal gate resistance. However, as compared to the turn-off behavior of the prior art, the turn-off speed for the composite device in FIG. 2C does not change significantly. Thus, increasing the pinch-off voltage for the JFET solves the issue related to turn-on of the device package, but does not resolve the rapid turn-off of such a cascode device.

An alternative method for increasing the turn-on speed (while simultaneously decreasing the turn-off speed) involves adjusting the internal gate resistance of the high-voltage normally-on device (e.g., JFET). A high JFET internal gate resistance slows down the turn-on rate of the composite device, and as such a low JFET internal gate resistance is desirable during turn-on. However, a low JFET internal gate resistance also leads to a much quicker turn-off rate, and so a high JFET internal gate resistance is desirable during turn-off.

Embodiments

Figure 3A:
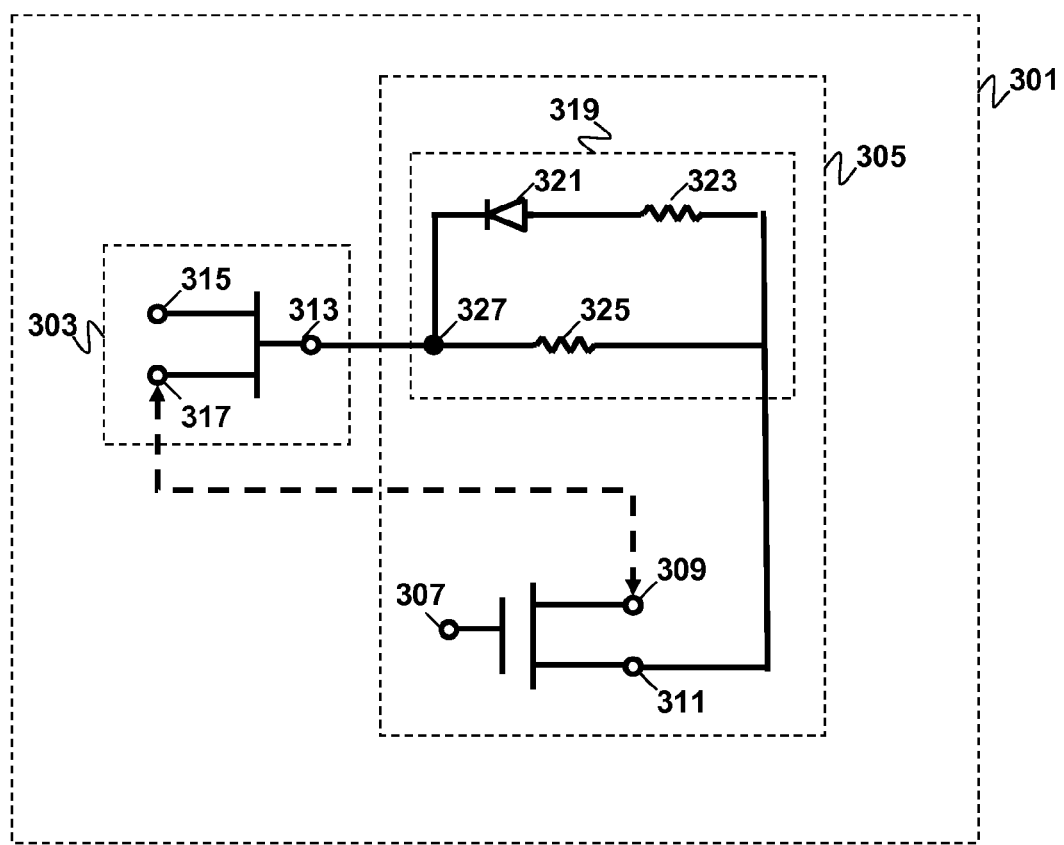
FIG. 3A is a schematic circuit diagram illustrating a cascode device with an external gate resistance circuit according to an embodiment of the present invention.

FIG. 3A illustrates a schematic circuit diagram that resolves the issues of slow turn-on/fast turn-off while keeping the above principles in mind. By way of example and not by way of limitation, the low voltage normally-off device 305 may be a MOSFET with a gate electrode 307, source electrode 311, and drain electrode 309. The high voltage normally-on device 303 may be a JFET with a gate electrode 313, source electrode 317, and drain electrode 315. While this particular example illustrates a MOSFET in series with a JFET, it is important to note that any combination of a high-voltage normally-on device in series with a low-voltage normally-off device may be used to implement a corresponding circuit structure in order to resolve turn-on/turn-off issues.

To accomplish both fast turn-on and slow-turn off, a control circuit, e.g., an external gate resistance circuit 319 in combination with a low JFET internal gate resistance, may be used to control the voltage and current flow of the composite device 301. The external gate resistance circuit 319 includes a low-resistance resistor 323 in series with a diode 321, the combination being in parallel with a high-resistance resistor 325. The external gate resistance circuit 319 is electrically connected between the MOSFET source 311 and the JFET gate 313 as illustrated.

This external gate resistance circuit 319 allows for current to pass through the low-resistance resistor/diode combination 321, 323 during device turn-on, leading to a much quicker turn-on rate. However, during device turn-off, the diode 321 blocks current flow through the low-resistance resistor 323. Instead, current flows through the high-resistance resistor 325, which causes turn-off to occur at a much more manageable rate.

Figure 3B:
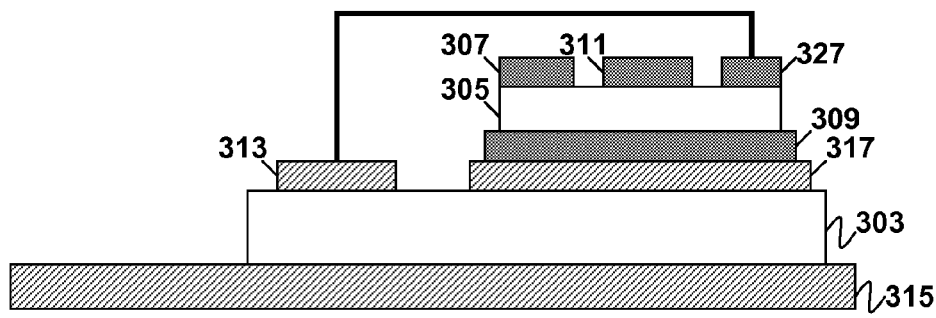
FIGS. 3B and 3C are cross-sectional view and top view schematic diagrams illustrating a cascode device with an external gate resistance circuit integrated into a low voltage FET according to an embodiment of the present invention.
Figure 3C:
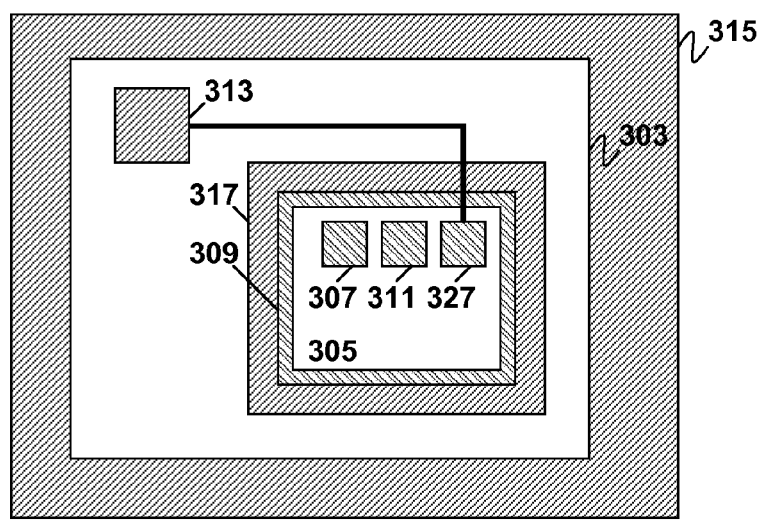

While composite devices of the type shown in FIG. 3A may be implemented in various ways, FIG. 3B and FIG. 3C illustrate a cross-sectional view and top-view of a preferred embodiment of the present invention configured as one semiconductor die mounted on a second semiconductor die, the combination of which is produced using a monolithic process. A low-voltage normally-off device (e.g., MOSFET) 305 with a source electrode 311, drain electrode 309, gate electrode 307, and auxiliary electrode 327 is supported by a high-voltage normally-on device (e.g., JFET) 303 with a source electrode 317, drain electrode 315, and gate electrode 313. The drain electrode 309 of the MOSFET rests directly on top of the source electrode 317 of the JFET. These two points of contact couple directly to each other, thus eliminating any inductance between those two points of contact and as well as any need for wiring.

The auxiliary electrode 327 provides a point of contact to the external gate resistance circuit 319 that can be built directly into the same die as the MOSFET device 305. The gate electrode 313 of the JFET device 303 can be electrically connected to the auxiliary electrode 327 of the MOSFET 305 in order to render the composite device 301. Whereas the prior art created a short-circuit between the gate 313 of the JFET and the source 311 of the MOSFET, the device package shown in FIGS. 3A-3C create an electrical connection between the gate 313 of the JFET and an external gate resistance circuit 319 that is electrically connected to the source 311 of the MOSFET.

Figure 3D:
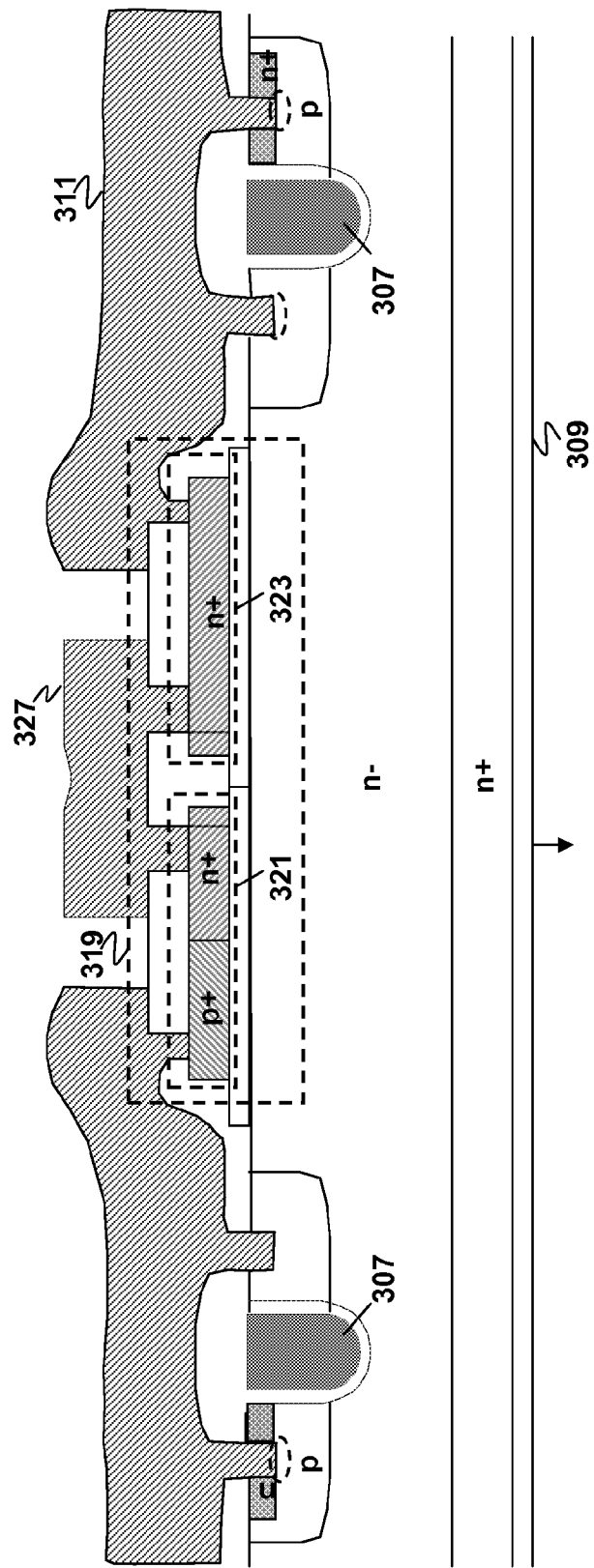
FIG. 3D is a cross-sectional view schematic diagram illustrating the low-voltage normally-off portion of the cascode device with an integrated external gate resistance circuit according to an embodiment of the present invention.

FIG. 3D illustrates a cross-sectional view of a low-voltage normally-off device 305 with the external gate resistance circuit 319 built in. By way of example, and not by way of limitation, the low voltage device 305 can be an n-type MOSFET with a gate region 307, source region 311, and drain region 309. The external gate resistance circuit 319 comprises a poly diode 321 and the high value turn-off poly-resistor 325, the combination being built directly into the n-type MOSFET. The p+ and n+ regions of the diode 321 can be sized to control the turn-on resistance 323. The external gate resistance circuit 319 may be accessed by way of the auxiliary pad 327. The external gate resistance circuit and n-type MOSFET behave as discussed above.

Figure 3E:
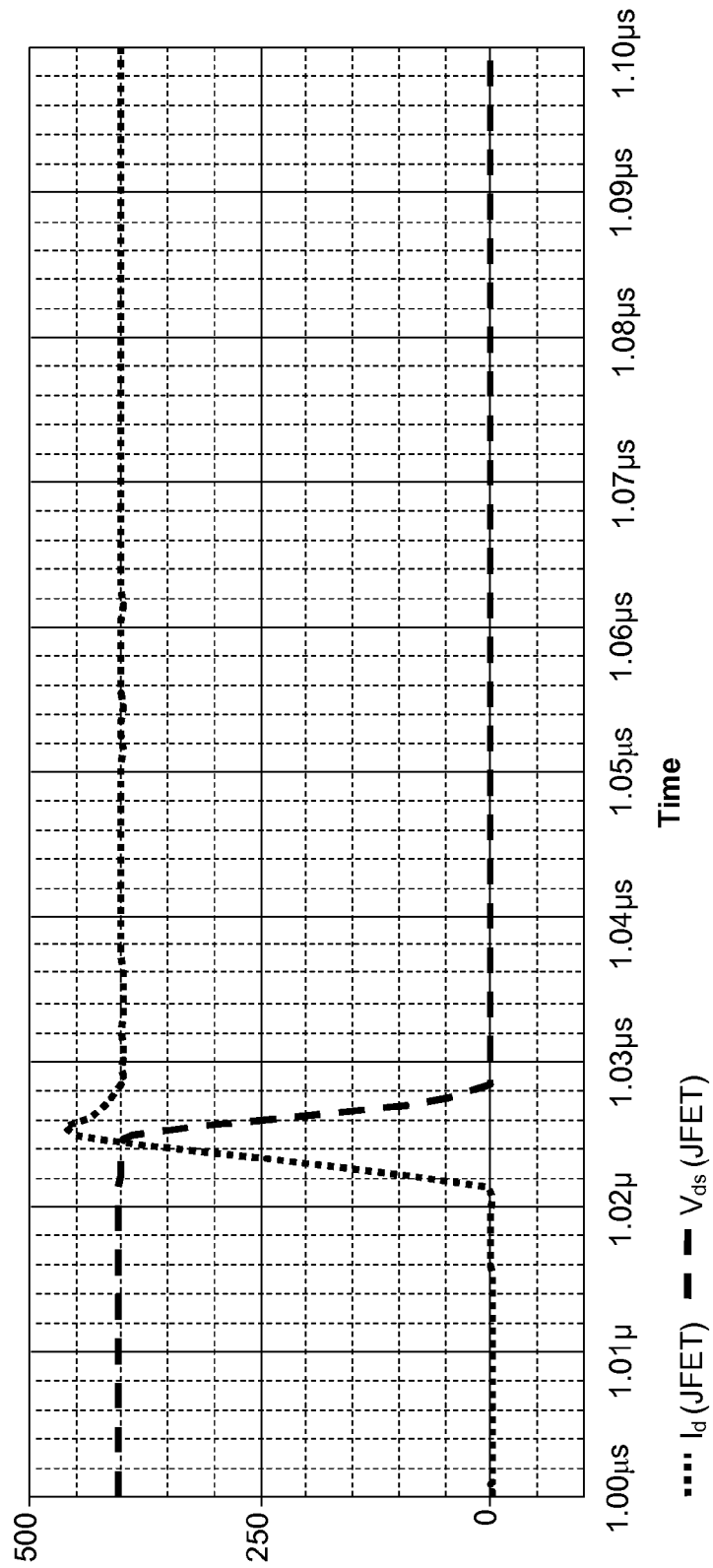
FIG. 3E is a graph illustrating the turn-on behavior of a cascode device with an external gate resistance circuit according to an embodiment of the present invention
Figure 3F:
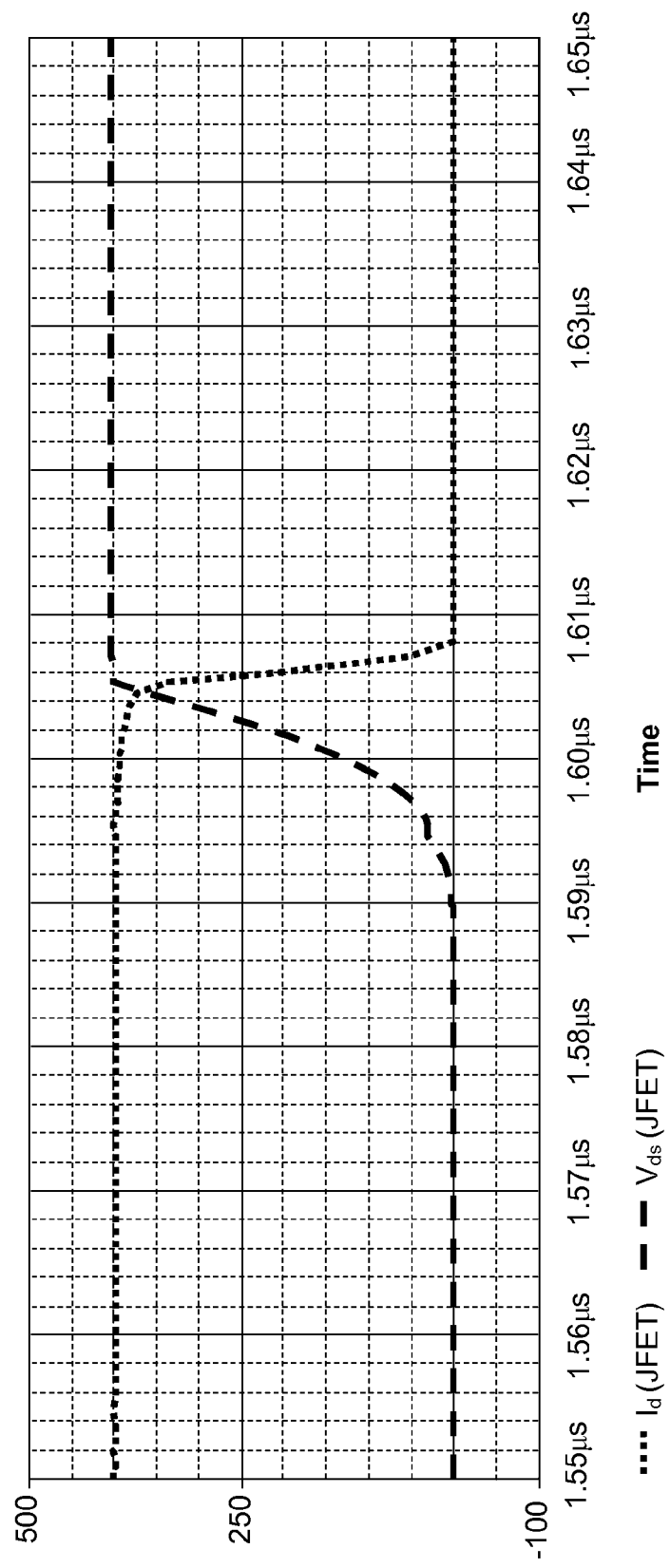
FIG. 3F is a graph illustrating the turn-off behavior of a cascode device with an external gate resistance circuit according to an embodiment of the present invention.

FIGS. 3E and 3F respectively illustrate the turn-on and turn-off behavior of an improved composite device of the type shown in FIGS. 3A-3D that implements integrated switching network. Both graphs illustrate the behavior of the JFET current ($I_d$) as well as the behavior of the JFET drain-source voltage ($V_{ds}$) as a function of time during turn-on and turn-off respectively. As compared to the turn-on behavior of the prior art cascode device, the turn-on speed for the composite device implementing integrated switching is much improved. The improved device exhibits a faster turn-on rate with controlled speed as shown in FIG. 3E. When compared to the turn-off behavior of the prior art cascode device, the turn-off speed for the improved composite device implementing integrated switching network is also much improved. As illustrated in FIG. 3F, the device exhibits a much slower turn-off rate with controlled speed without compromising other factors.

Figure 4A:
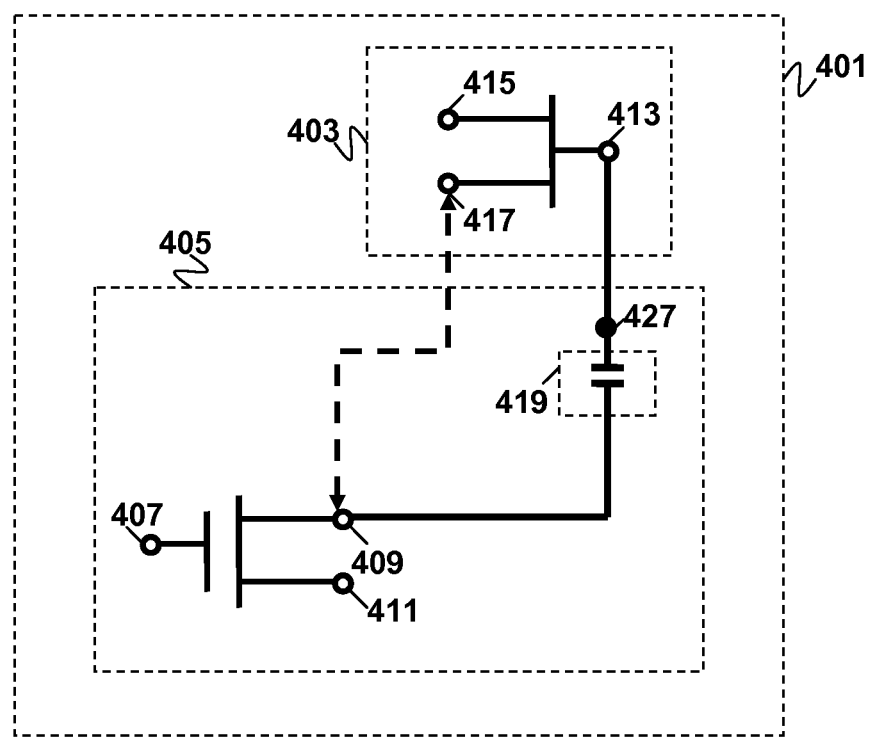
FIG. 4A is a schematic circuit diagram illustrating a cascode device with a capacitor according to an embodiment of the present invention.

Another method for decreasing the current turn-off speed (dI/dt) for improved composite devices within the scope of embodiments of the present invention involves adding a capacitor between the drain of a low-voltage normally-off device and the gate of a high-voltage normally-on device. FIG. 4A illustrates a schematic circuit diagram for such a composite device. By way of example and not by way of limitation, the low voltage normally-off device 405 can be a MOSFET with a gate electrode 407, source electrode 411, and drain electrode 409. The high voltage normally-on device 403 can be a JFET with a gate electrode 413, source electrode 417, and drain electrode 415. While this particular example illustrates a MOSFET in series with a JFET, it is important to note that any combination of a high-voltage normally-on device in series with a low-voltage normally-off device may be used to implement a corresponding structure.

As shown in FIG. 4A, a control circuit may include a capacitor 419 electrically connected between the drain 409 of the MOSFET and the gate 413 of the JFET. The capacitor 419 serves to slow down the rate of current change for the composite device 401 as JFET gate current is used to charge the capacitor 419. This in turn reduces the turn-off rate of the cascode device 401.

Without being limited by any particular theory of operation, the introduction of the capacitor 419 between the drain 409 of the MOSFET and gate 413 of the JFET can control switching speeds of the composite device 401 in one of two ways. First, the capacitor 419 may slow down the rate at which current can rise or fall in the JFET 403, which in turn slows down the rate of turn-off for the composite device 401. Second, normally if a high voltage spike occurs across the composite device 401 at a very high rate of voltage change, the large coupling capacitance (i.e., Miller capacitance) that exists between the JFET drain 415 and the JFET gate 413 will accidently make the device 401 turn on when it's supposed to be in its off-state. This will in turn cause the composite device 401 to short-circuit the power supply it might be connected to. However, by introducing a capacitor 419 between the MOSFET drain 409 and JFET gate 413, a high voltage spike will no longer cause the device 401 to accidently turn-on, and as such short-circuiting of the device may be avoided.

Figure 4B:
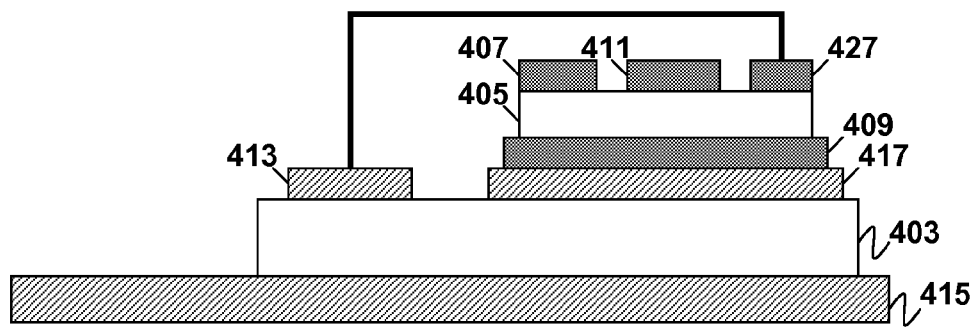
FIGS. 4B and 4C are cross-sectional view and top view schematic diagrams illustrating a cascode device with a capacitor integrated into a low voltage FET according to an embodiment of the present invention.
Figure 4C:
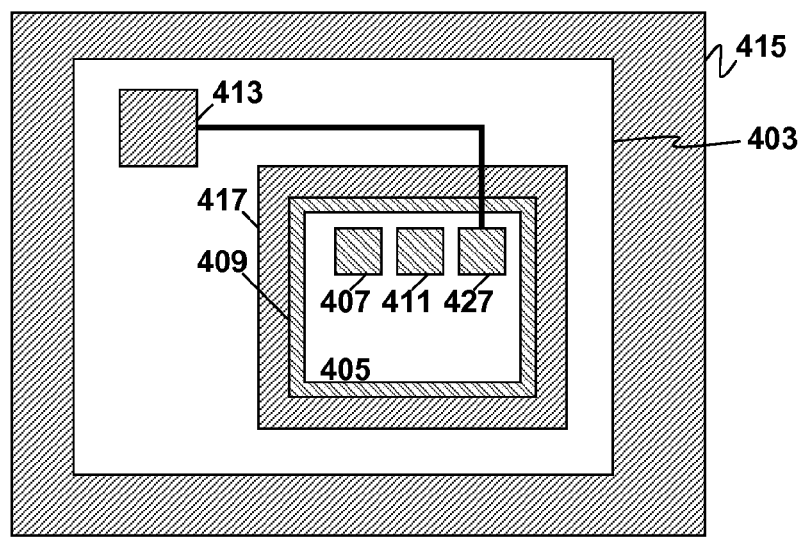

While this composite device may be implemented in various ways, FIG. 4B and FIG. 4C illustrate a cross-sectional view and top-view of a preferred embodiment of the present invention configured as one semiconductor die mounted on a second semiconductor die. A low-voltage normally-off device (e.g., MOSFET) 405 with a source electrode 411, drain electrode 409, gate electrode 407, and auxiliary electrode 427 is supported by a high-voltage normally-on device (e.g., JFET) 403 with a source electrode 417, drain electrode 415, and gate electrode 413. The drain electrode 409 of the MOSFET rests directly on top of the source electrode 417 of the JFET. These two points of contact couple directly to each other, thus eliminating any inductance between those two points of contact and any need for wiring.

The auxiliary electrode 427 provides a point of contact to the capacitor 419, which can be built directly into the MOSFET device 405. In our particular setup, the gate electrode 413 of the JFET device 403 must be electrically connected to the auxiliary electrode 427 of the MOSFET in order to render the composite device 401. Whereas the prior art created a short-circuit between the gate 413 of the JFET and the source 411 of the MOSFET, the improved device package creates an electrical connection between the gate 413 of the JFET and a capacitor 419 that is electrically connected to the drain 409 of the MOSFET.

Figure 4D:
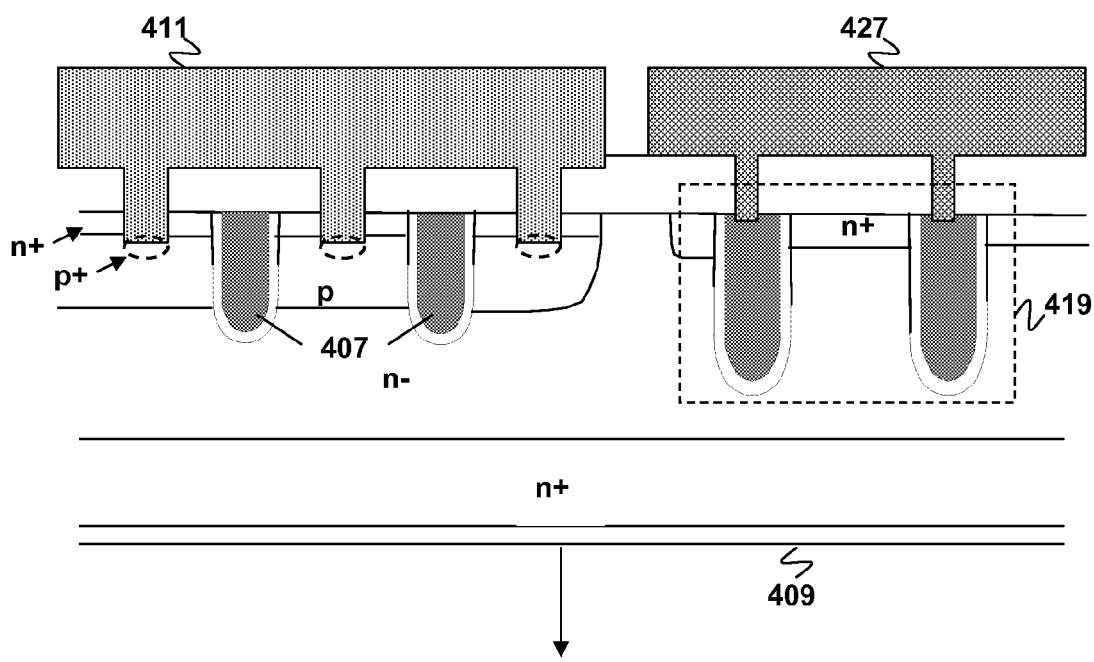
FIG. 4D is a cross-sectional view schematic diagram illustrating the low-voltage normally-off portion of the cascode device with an integrated capacitor according to an embodiment of the present invention.
Figure 5A:
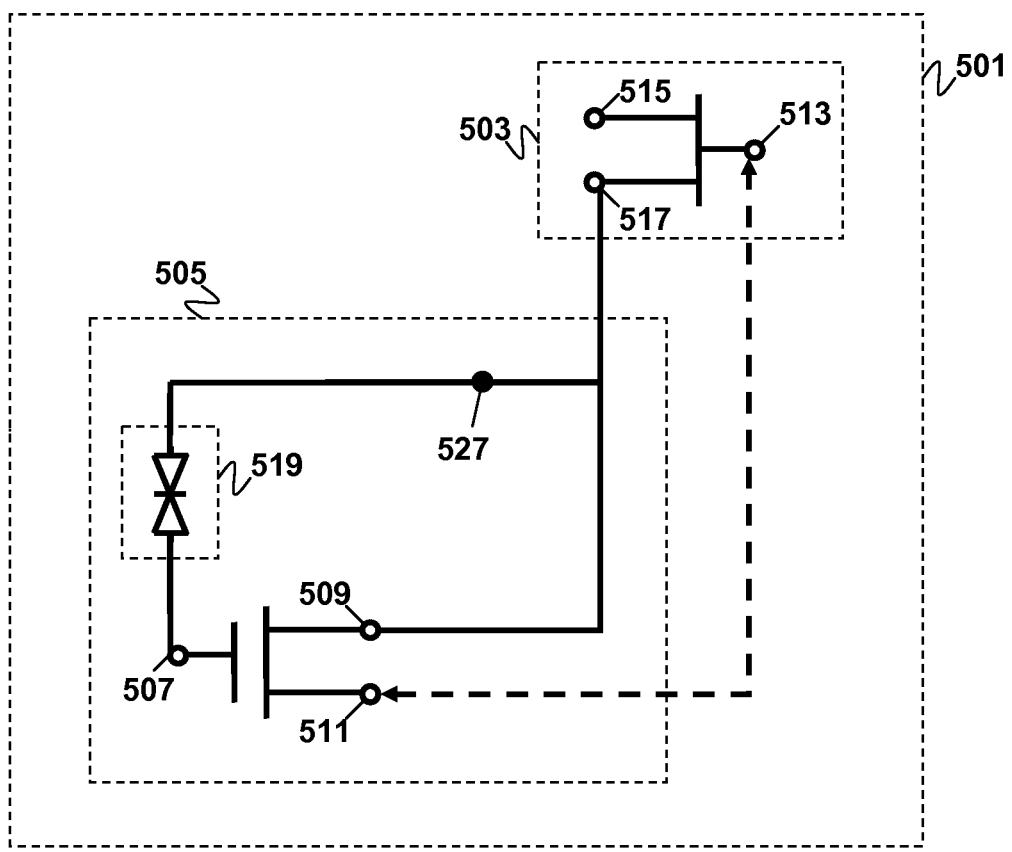
FIG. 5A is a schematic circuit diagram illustrating a cascode device with a zener clamp according to an embodiment of the present invention.

FIG. 4D illustrates a cross-sectional view of a low-voltage normally-off device with the capacitor built in. By way of example, and not by way of limitation, the low voltage device 405 is an n-type MOSFET with a gate region 407, source region 411, and drain region 409. The capacitor 419 is connected in series with the MOSFET drain 409. The capacitance of the capacitor 419 may be increased or decreased by increasing or decreasing the area it encompasses within the MOSFET device respectively. The capacitor 319 may be accessed by way of the auxiliary pad 327. The capacitor and n-type MOSFET behave as discussed above Yet another method for decreasing the turn-off speed for such a composite device involves adding a control circuit including a Zener clamp (i.e., back to back Zener diodes). FIG. 5A illustrates a schematic circuit diagram illustrating an example of this composite device according to an embodiment of the present invention. By way of example and not by way of limitation, the low voltage normally-off device 505 may be a MOSFET with a gate electrode 507, source electrode 511, and drain electrode 509. The high voltage normally-on device 503 may be a JFET with a gate electrode 513, source electrode 517, and drain electrode 515. While this particular example illustrates a MOSFET in series with a JFET, it is important to note that any combination of a high-voltage normally-on device in series with a low-voltage normally-off device may implement the following structure in order to resolve turn-off issues.

When a prior art composite device 501 is turned off, if too much voltage is allowed to build up across the low-voltage MOSFET 505, three potential problems occur. The first problem involves a very large reverse voltage developing across the JFET internal gate resistance $R_{G(JFET)}$, which causes the prior art composite device to turn-off much too fast. The second problem that can occur is that the low voltage MOSFET 505 can be repetitively driven into avalanche breakdown, leading to possible device failure. The third problem that can occur from this excessive voltage is that the gate-source rating of the JFET may be exceeded, causing the high voltage device to fail.

In order to avoid these problems, the reverse voltage that develops across the MOSFET should be limited to a value that sits below the breakdown voltage of the MOSFET, and within the gate-source rating of the JFET. By introducing the zener clamp 519 into the MOSFET, the device 501 may exercise complete control over the MOSFET drain-source voltage without forcing the MOSFET 505 into avalanche breakdown. The zener clamp 519 is positioned between the gate 507 and drain 509 of the MOSFET and configured to slow down excessively fast device turn-off by constraining the maximum voltage that may fall across the JFET internal gate resistance $R_{G(JFET)}$.

Figure 5B:
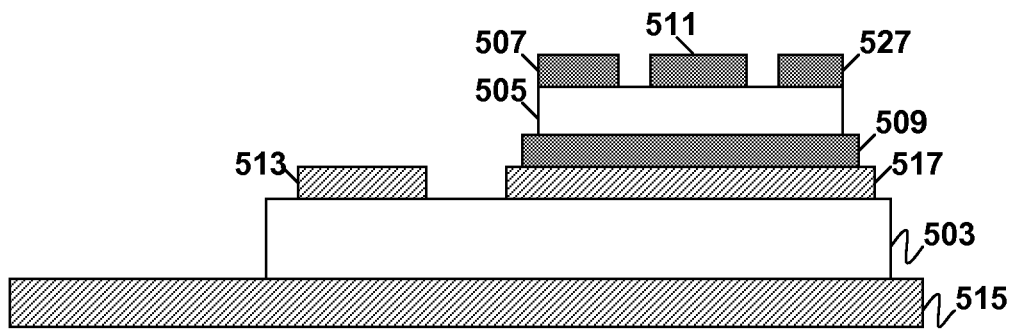
FIGS. 5B and 5C are top-view and cross-sectional view schematic diagrams illustrating a cascode device with a zener clamp integrated into a low voltage FET according to an embodiment of the present invention.
Figure 5C:
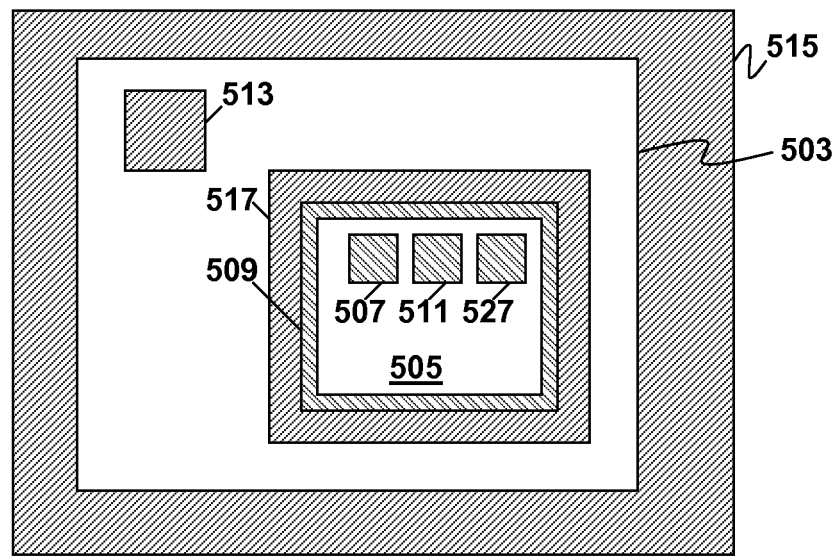

While this composite device 501 may be implemented in various ways, FIG. 5B and FIG. 5C illustrate a cross-sectional view and top-view of a preferred embodiment of the present invention configured as one semiconductor die mounted on a second semiconductor die. A low-voltage normally-off device (e.g., MOSFET) 505 with a source electrode 511, drain electrode 509, gate electrode 507, and an optional auxiliary electrode 527 is supported by a high-voltage normally-on device (e.g., JFET) 503 with a source electrode 517, drain electrode 515, and gate electrode 513. In certain embodiments, the zener diode clamp 519 can be directly integrated between the gate 507 and the drain 509 of the low voltage MOSFET. In such embodiments, the auxiliary electrode 527 may be omitted entirely and the JFET gate 513 may be connected directly to the low voltage MOSFET source 511, and so the low voltage MOSFET 505 can be a 3-terminal device. However, the integrated Zener diode clamp 519 can also be use in conjunction with an integrated diode-resistor configuration of the type shown in FIG. 3A, or an integrated capacitor configuration of the type shown in FIG. 4A. Consequently, the low voltage MOSFET 505 can still be a 4-terminal device that includes the auxiliary terminal 527. The drain electrode 509 of the MOSFET 505 rests directly on top of the source electrode 517 of the JFET 503. These two points of contact couple directly to each other, thus eliminating any inductance between those two points of contact and any need for wiring.

The zener clamp 519 can be built directly into the MOSFET device 505. By way of example, and not by way of limitation, the connections between the MOSFET drain 509, zener clamp 519, and MOSFET gate 507 can be made within the MOSFET 505 using a monolithic process that avoids any external wiring.

Figure 5D:
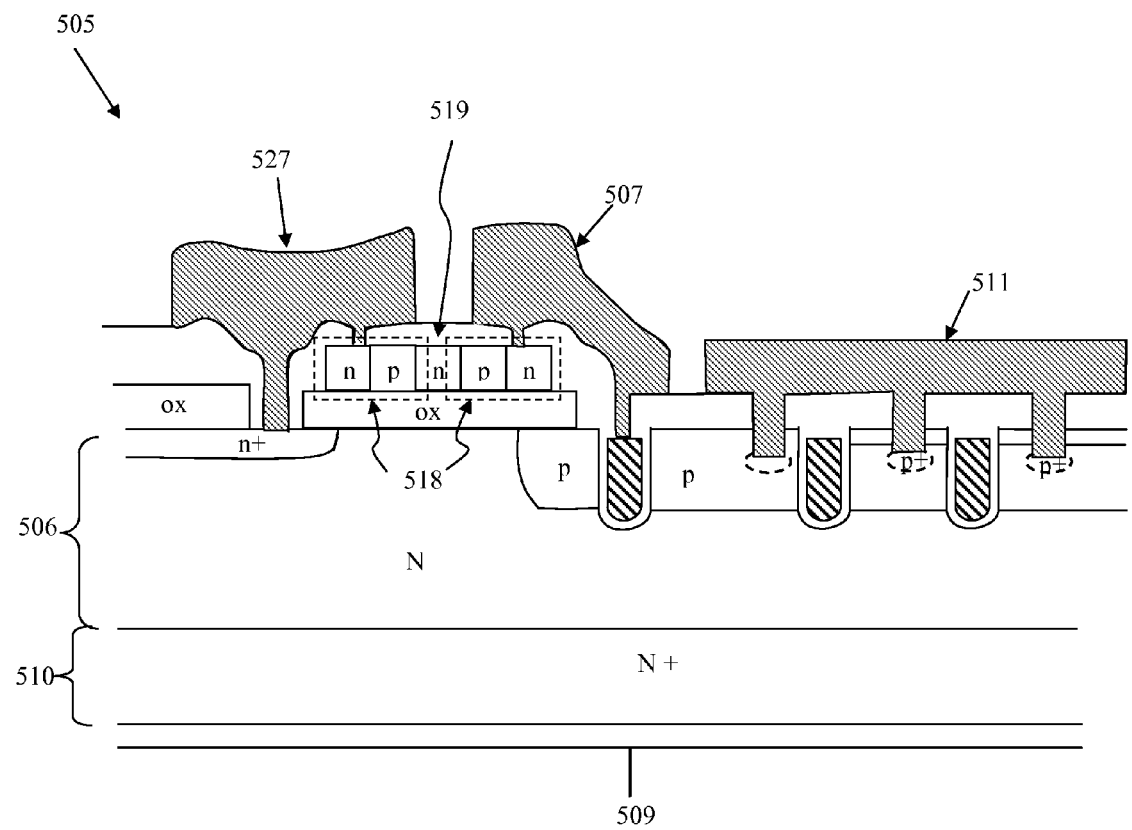
FIG. 5D shows a cross-sectional view of a clamp implemented between the low voltage FET gate and drain.

By way of example, FIG. 5D shows the cross-section of a low voltage MOSFET 505 with a gate-to drain clamp 519 monolithically integrated in the form of back-to-back polysilicon diodes. A plurality of polysilicon diodes 518 in backto-back series connection has one end connected to gate electrode 507 and another end connected to the auxiliary electrode 527. As shown in FIG. 5D, the auxiliary electrode 527 is electrically connected to the drain 509 of MOSFET 505 through a semiconductor substrate 510 and an epitaxial layer 506 on which the MOSFET 505 is formed. If the voltage across the MOSFET becomes high enough, the back-to-back diodes can be designed to breakdown before the MOSFET drain-source junction avalanches. The current flow though the G-D zener diodes must then flow through the gate resistance in the external circuit. The voltage drop created across the gate resistance will turn the MOSFET channel on just enough to sustain the MOSFET drain current, with the MOSFET drain-source voltage limited to a value of zener breakdown plus the MOSFET gate-source voltage. Since the MOSFET is never driven into avalanche breakdown, this avoids the possibility of MOSFET failure by parasitic bipolar turn-on. There are many techniques well known in the art to achieve a lower breakdown area within the power MOSFET with the intent of limiting the avalanche current to an area which is not as susceptible to failure.

Figure 5E:
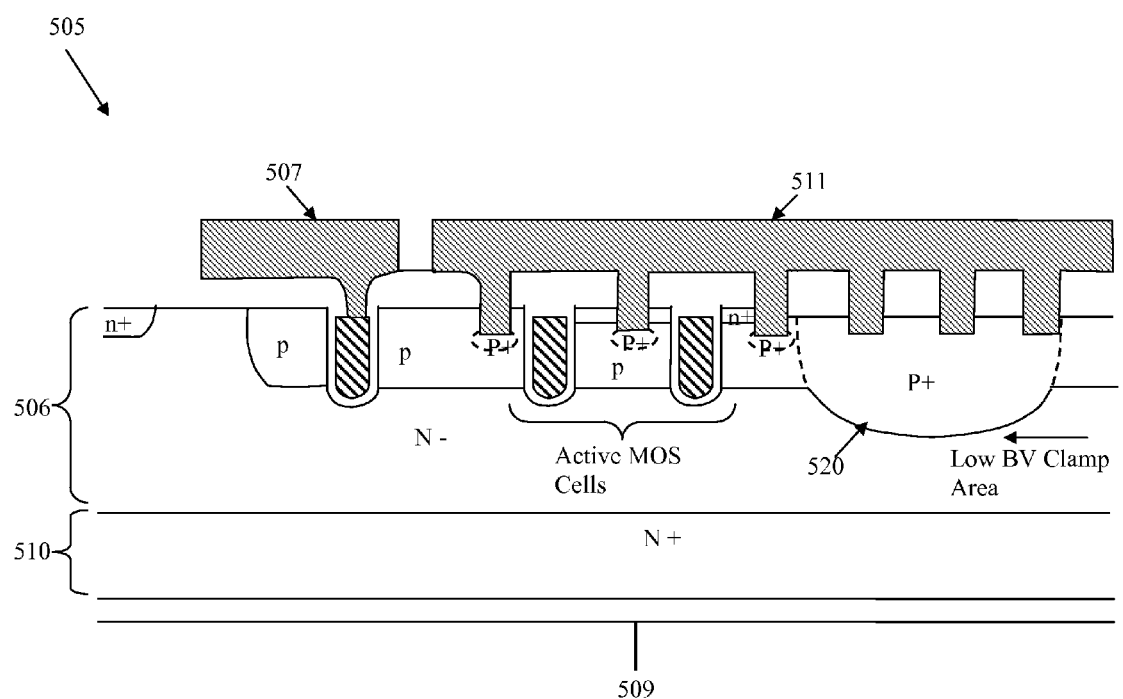
FIG. 5E shows a cross-sectional view of a clamp implemented between the low voltage FET drain and source respectively.

FIG. 5E shows a different type of clamp, this time integrated into the MOSFET 505 between the drain 509 and source 511. A deep P+ implant region 520 extending below the bottom of a gate trench is provided to form a PN junction with an N− epitaxial layer 506 formed on a substrate 510 for clamping the drain-source voltage. The deep P+ implant region 520 is connected to the source metal 511 through a plurality of contact openings. By controlling the depth and doping profile of the deep P+ region 520, the breakdown voltage of the PN can be adjusted. Since avalanche current is confined to this region, and since this region is a diode, it is possible to avoid MOSFET failure due to parasitic bipolar turn-on. Depending on the amplitude of avalanche current, the number of contact openings connected to the deep P+ region 520 can be proportionally increase. Both of the embodiments shown in FIGS. 5D and 5E accomplish the objective of limiting the maximum voltage developed across the low voltage MOSFET, and consequently, the maximum voltage across the normally-on JFET gate-source.

In addition to having undesirable turn-on/turn-off characteristics, prior art composite devices also tend to behave poorly when used to replace an insulated-gate bipolar transistor (IGBT) in a power circuit, especially in the event of a short circuit of the load, whereby the IGBT is turned on into a large voltage, leading to a period of very high current and voltage. The IGBT is required to turn-off safely after a few microseconds when such a condition is detected. The IGBT is a three-terminal power semiconductor device that combines the simple gate-driven characteristics of a MOSFET with the high-current and low-saturation-voltage capability of a bipolar transistor. A composite device being used as an IGBT has the potential to fail when such a short circuit condition occurs if excessive stress occurs on the low voltage device.

Figure 6:
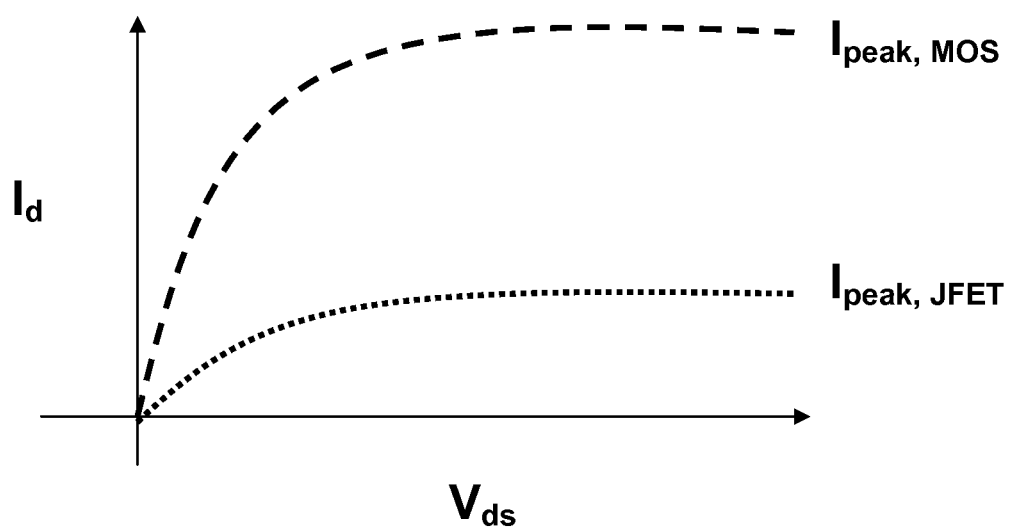
FIG. 6 is a graph illustrating an $I_d$–$V_{ds}$ curve for the cascode device where the low-voltage normally-off field effect transistor is a MOSFET and the high-voltage normally-on field effect transistor is a JFET.

FIG. 6 illustrates an $I_d$-$V_{ds}$ curve for the components of a cascode device where the low-voltage normally-off field effect transistor is a MOSFET and the high-voltage normally-on field effect transistor is a JFET. As illustrated, the MOSFET exhibits a higher saturation current than the JFET. This causes the JFET to saturate, and for most of the voltage to build up across the JFET instead of the MOSFET in the event of a short circuit. Since the high voltage JFET is designed to support the high voltage, it is desirable to allow power dissipation in the JFET to dominate during such short circuit events. This is especially the case when the JFET is a wide bandgap semiconductor device, which has the property of being able to handle much higher levels of power dissipation and junction temperature before failure occurs.

To control power dissipation such that it is dominant in the JFET, the JFET must be built to saturate at a lower current than the MOSFET so that most of the voltage during accidental turn-on will fall across the JFET and only a little will fall across the MOSFET. This may be accomplished by controlling the transconductance of the MOSFET and JFET. The MOSFET transconductance can be maximized, e.g., by increasing cell density, and using a short channel length. The gate oxide thickness can be the minimum needed to meet the gate-source rating requirements, and the threshold voltage can be kept well below the gate driving voltage. The transconductance of the JFET may be controlled by manipulating the pinch-off voltage of the device as well as by controlling the cell-pitch and channel length associated with the device.

Another issue that arises during operation of the prior art composite device involves cascode diode recovery. Sometimes when the composite device is connected to an inductive load, the current may begin to flow in a reverse direction for brief periods of time. In a cascode, the effective body diode of the device is the low-voltage normally-off field effect transistor body diode in series with the normally-on JFET, the latter acting like a majority carrier resistor. This provides an excellent low diode voltage drop during conduction. However, the cascode device cannot begin blocking voltage until the low voltage diode recovers from reverse current flow.

Figure 7A:
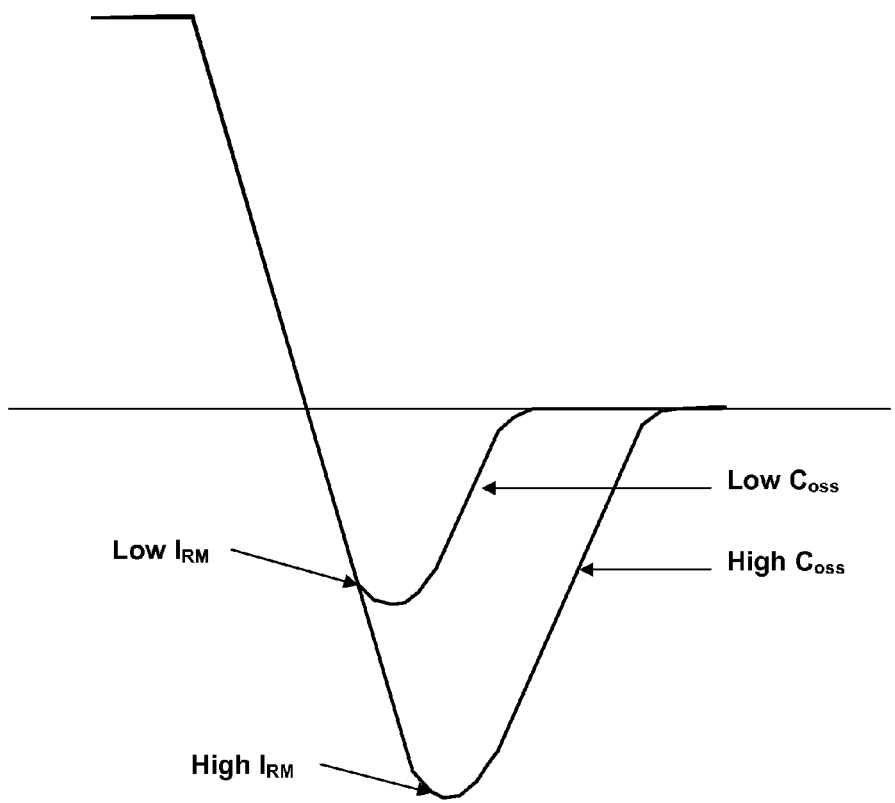
FIG. 7A are graphs illustrating the recovery behavior of a cascode device depending on its $C_{oss}$ value.

Thus, a high reverse recovery current $I_{rm}$, resulting from a high stored charge (or $C_{oss}$) in the low-voltage normally-off field effect transistor will cause considerable recovery loss in the cascode. This issue is best addressed by having a low $C_{oss}$ device with low stored charge acting as the low-voltage normally-off field effect transistor. FIG. 7A are graphs illustrating the recovery behavior of a cascode device depending on its $C_{oss}$ value. As shown, a device with a low $C_{oss}$ value recovers much more quickly with lower peak recovery current $I_{rm}$ from reverse current flow than one with a higher $C_{oss}$ value.

It should be noted that in order for the composite diode to start blocking voltage in the diode recovery mode, once the low voltage MOSFET body diode recovers, the normally-on JFET must turn-off quickly. If the turn-off circuit is designed to be too slow, the delay in JFET turn-off can lead to an unacceptable increase in reverse recovery time and current. When designing devices for use in circuits where body diode recovery commonly occurs, turn-off should not be excessively slowed. A good design point is the maximum turn-off speed compatible with a tolerable oscillation level and EMI performance.

Figure 7B:
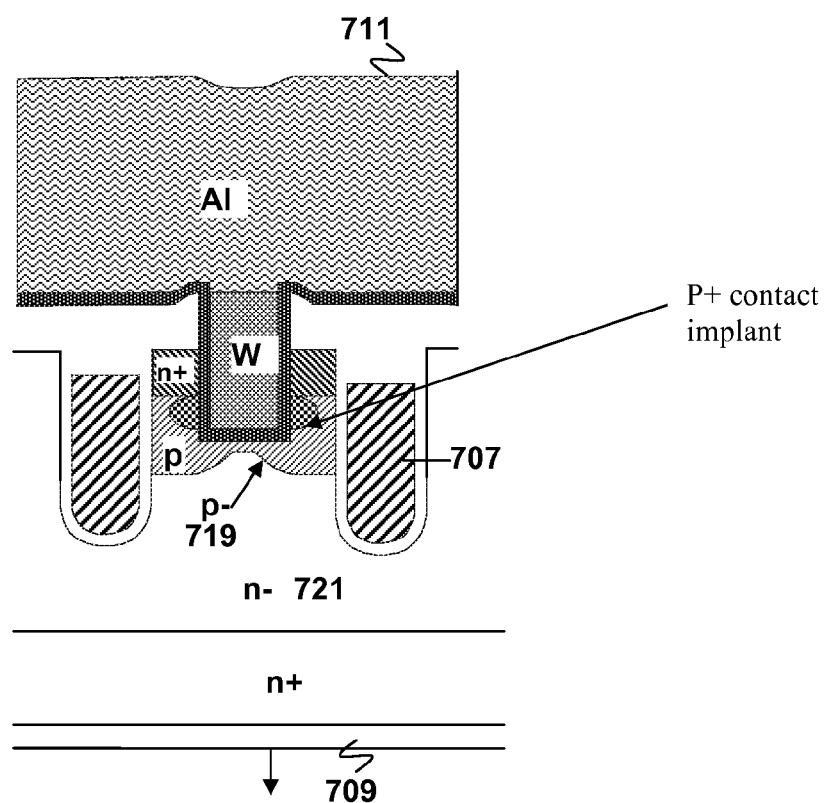
FIG. 7B is a cross-sectional schematic diagram of an example of a low-voltage normally-off device designed to exhibit a low $C_{oss}$ value.

FIG. 7B illustrates a cross-sectional diagram of a low-voltage normally-off device designed to exhibit a low $C_{oss}$ value. The low-voltage device 705 is a n-type field effect transistor with a gate region 707, source region 711, and drain region 709. Many variables are involved in maintaining a low $C_{oss}$ value for such a low-voltage normally-off device. Thick bottom oxide or TBO helps reduce $C_{oss}$. Similarly, a high cell density reduces the PN junction area, which leads to a lower $C_{oss}$ value. Also, the manner of contact formation, where the bottom part of the p+ contact implant (see my new label in the figure) common to low voltage MOSFETs is etched away, and replaced by a p− shallow implant area 719 reduces injection efficiency and stored charge, leading to a lower $I_{RM}$ value. Furthermore, counter-doping the semiconductor region 721 area below the p− implant area 719 may be used to further reduce the $C_{oss}$ value.

Many different low-voltage field effect transistors exhibit low $C_{oss}$ values, but not all ideally resolve the issues discussed above. An SRFET (a FET having an integrated Schottky diode) works best for cascode diode recovery, but hot leakage issues will lead to high drain-source leakage at high temperatures for the cascode device leading to off-state power losses and might also degrade short circuit behavior by leading to thermal runaway from the rapid rise of leakage as the device is heated by the applied power. However, a metal-oxide semiconductor device with a contact region modified as shown in FIG. 7B, also referred to as an SDMOS (smart diode MOS) with a low injection efficiency, low leakage body diode would be optimal for providing excellent cascode diode recovery, as well as for resolving all the other issues involved with the prior art. The SDMOS exhibits low injection efficiency, lower leakage, and reduced stored charge, all characteristics favorable for quick cascode diode recovery.

The type of low-voltage normally-off device shown in FIG. 7B and others are described in detail in commonly-assigned U.S. patent application Ser. No. 12/005,130, filed Dec. 21, 2007, and published Mar. 12, 2009 as U.S. Patent Application Publication Number 2009/0065861, to Anup Bhalla et al, entitled "MOS DEVICE WITH LOW INJECTION DIODE", the entire contents of both of which are incorporated herein by reference.

Although the present invention has been described in considerable detail with reference to certain preferred versions thereof, other versions are possible. For example, although certain embodiments are described in which the low-voltage normally-off device is a MOSFET and the high-voltage normally-on device is a JFET, those of skill in the art will recognize that other types of transistors can be used. Therefore, the spirit and scope of the appended claims should not be limited to the description of the preferred versions contained herein. Instead, the scope of the invention should be determined with reference to the appended claims, along with their full scope of equivalents.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features. Any feature, whether preferred or not, may be combined with any other feature, whether preferred or not. In the claims that follow, the indefinite article "A", or "An" refers to a quantity of one or more of the item following the article, except where expressly stated otherwise. Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

The reader's attention is directed to all papers and documents which are filed concurrently with this specification and which are open to public inspection with this specification, and the contents of any papers and documents incorporated herein by reference.

What is claimed is:

1. A switching device, comprising:
a low voltage normally-off field effect transistor having four or more electrodes including a source electrode, a drain electrode, a gate electrode, and one or more auxiliary electrodes, wherein the drain electrode is on one surface of a semiconductor die from which the low voltage normally-off transistor is formed, while each of the remaining electrodes is located on an opposite surface of the semiconductor die, the one or more auxiliary electrodes providing electrical contact to a control circuit that is electrically connected to one or more of the other electrodes, wherein the one or more auxiliary electrodes are not directly connected to any of a source region, a gate region, or a drain region of the low voltage normally-off field effect transistor, wherein the control circuit is built into the semiconductor die from which the low voltage normally-off transistor is formed.

2. The switching device of claim 1, wherein the control circuit is an external gate resistance circuit, the external gate resistance circuit comprising a low-resistance resistor connected in series with a diode, and a higher resistance connected in parallel, wherein an anode-side of the diode part of the external gate resistance circuit is connected to the source terminal of the low voltage normally-off transistor.

3. The switching device of claim 2, further comprising a high voltage normally-on transistor having a source electrode, a drain electrode, and a gate electrode, wherein each of the three electrodes is located on a surface of an additional die, the gate electrode of the high voltage normally-on transistor being electrically connected to the auxiliary electrode of the low voltage normally-off transistor and the source electrode of the high voltage normally-on transistor being electrically connected to the drain electrode of the low voltage normally-off transistor.

4. The switching device of claim 1, wherein the control circuit is an external gate resistance circuit, the external gate resistance circuit comprising a diode, and a separate resistance connected in parallel, wherein an anode-side of the diode part of external gate resistance circuit is connected to the source terminal of the low voltage normally-off transistor.

5. The switching device of claim 4, further comprising a high voltage normally-on transistor having a source electrode, a drain electrode, and a gate electrode, wherein each of the three electrodes is located on a surface of an additional die, the gate electrode of the high voltage normally-on transistor being electrically connected to the auxiliary electrode of the low voltage normally-off transistor and the source electrode of the high voltage normally-on transistor being electrically connected to the drain electrode of the low voltage normally-off transistor.

6. The switching device of claim 4, wherein the low-voltage normally-off transistor operates at a higher saturation current than the high-voltage normally-on transistor.

7. The switching device of claim 4, wherein the drain electrode of the low-voltage normally-off transistor is mounted on the source electrode of the high-voltage normally-on transistor such that the drain electrode and source electrode form an electrical connection.

8. The switching device of claim 4, wherein the high-voltage normally-on transistor is a junction gate field effect transistor (JFET), a HFET (hetero structure field effect transistor, or MESFET (Metal Semiconductor Field Effect Transistor).

9. The switching device of claim 4, wherein the low-voltage normally-off transistor is a metal-oxide semiconductor field effect transistor (MOSFET) device.

10. The switching device of claim 1, wherein the control circuit includes a capacitor, the control circuit being connected to the drain terminal of the low voltage normally-off transistor.

11. The switching device of claim 10, further comprising a high voltage normally-on transistor having a source electrode, a drain electrode, and a gate electrode formed on an additional die, wherein the drain electrode is on one surface of the additional die and the other electrodes are on an opposite surface of the additional die, wherein the gate electrode of the high voltage normally-on transistor is electrically connected to the auxiliary electrode of the low voltage normally-off transistor and the source electrode of the high voltage normally-on transistor is electrically connected to the drain electrode of the low voltage normally-off transistor.

12. The switching device of claim 11, wherein the low-voltage normally-off transistor operates at a higher saturation current than the high-voltage normally-on transistor.

13. The switching device of claim 11, wherein the die on which the low voltage normally-off transistor is formed is mounted to the additional die such that the drain electrode of the low-voltage normally-off transistor is in direct electrical contact with the source electrode of the high-voltage normally-on transistor.

14. The switching device of claim 11, wherein the high-voltage normally-on transistor is a junction gate field effect transistor (JFET), a hetero structure field effect transistor (HFET), or Metal Semiconductor Field Effect Transistor (MESFET).

15. The switching device of claim 1, wherein the control circuit comprises two or more diodes of opposite polarity in series, an anode of the first diode being electrically connected to the drain electrode of the low voltage normally-off transistor and an anode of the second diode being electrically connected to the gate electrode of the low voltage normally-off transistor.

16. The switching device of claim 15, wherein each of the two diodes is a zener diode.

17. The switching device of claim 15, wherein the two diodes are back-to-back zener diodes integrated into the low-voltage normally-off transistor between the gate electrode and the drain electrode.

18. The switching device of claim 15, wherein the control circuit includes a diode clamp integrated into the low-voltage normally-off transistor between a source of the normally-off transistor and the drain electrode.

19. The switching device of claim 15, further comprising a high voltage normally-on transistor having a source electrode, a drain electrode, and a gate electrode, formed on an additional die, wherein the drain electrode is on one surface of the additional die and the other electrodes are on an opposite surface of the additional die, wherein the gate electrode of the high voltage normally-on transistor is electrically connected to the source electrode of the low voltage normally-off transistor and the source electrode of the high voltage normally-on transistor is electrically connected to the drain electrode of the low voltage normally-off transistor.

20. The switching device of claim 19, wherein the low-voltage normally-off transistor operates at a higher saturation current than the high-voltage normally-on transistor.

21. The switching device of claim 19, wherein the die on which the low voltage normally-off transistor is formed is mounted to the additional die such that the drain electrode of the low-voltage normally-off transistor is in direct electrical contact with the source electrode of the high-voltage normally-on transistor.

22. The switching device of claim 19, wherein the high-voltage normally-on transistor is a junction gate field effect transistor (JFET).

23. The switching device of claim 1, wherein the low voltage normally-off transistor is a metal-oxide semiconductor field effect transistor (MOSFET).

* * * * *